United States Patent [19]

Chin

[11] Patent Number: 4,662,983

[45] Date of Patent: May 5, 1987

[54] MULTIPLE MELTBACK PROCEDURE FOR LPE GROWTH ON INP

[75] Inventor: Brymer H. Chin, North Plainfield, N.J.

[73] Assignee: American Telephone and Telegraph Company AT&T Bell Laboratories, Murray Hill, N.J.

[21] Appl. No.: 729,910

[22] Filed: May 3, 1985

Related U.S. Application Data

[63] Continuation of Ser. No. 436,681, Oct. 26, 1982, abandoned.

[51] Int. Cl.$^4$ ............................................. C30B 29/40
[52] U.S. Cl. ................................. 156/624; 156/637; 156/651; 156/DIG. 105; 156/DIG. 70; 148/DIG. 17; 148/DIG. 108; 148/DIG. 131; 148/173; 134/21
[58] Field of Search ..... 156/620, DIG. 105, DIG. 70, 156/624, 635, 651, 654, 637; 148/171, 173, DIG. 54, DIG. 56, DIG. 108, DIG. 31, DIG. 72; 427/87; 134/21

[56] References Cited

U.S. PATENT DOCUMENTS 4,012,242 3/1977 Matare .............................. 148/172
4,227,962 10/1980 Antypas ...................... 156/DIG. 70
4,373,989 2/1983 Beggs .................................. 156/622
4,480,331 10/1984 Thompson ......................... 148/172

OTHER PUBLICATIONS

Brown, Jl of Crystal Growth 20 (1973) pp. 161-164.
Wrick et al, Electronics Letters 5 Aug. 76, V. 12, No. 6, pp. 394-395.
Yamamoto et al, IEEE Jl of Quantum Electronics VQE-14, No. 2/78.
Wright et al, IEEE Transactions on Electronic Devices, ED-26, No. 8, 8/79.
Digiuseppe et al, Jl of Crystal Growth 58 (1982) pp. 279-284.

Primary Examiner—Gary P. Straub
Attorney, Agent, or Firm—Michael J. Urbano

[57] ABSTRACT

A multiple meltback procedure is described for removing gross contaminants and thermal degradation from InP-containing surfaces. Prior to LPE growth on an InP substrate, the substrate surface is brought into contact briefly ($\lesssim 1$ sec) with an essentially pure In melt and is then brought into contact with a slightly undersaturated In/P melt. A similar triple meltback procedure is described for use prior to LPE growth over a mesa (e.g., in the fabrication of buried heterostructures).

15 Claims, 1 Drawing Figure

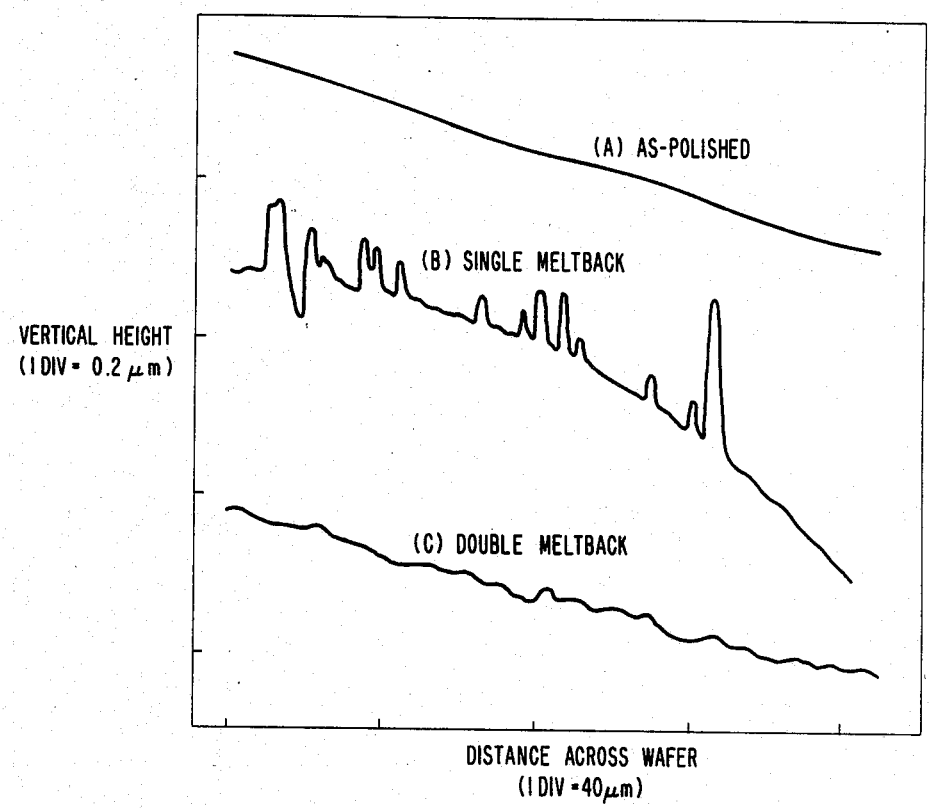

MULTIPLE MELTBACK PROCEDURE FOR LPE GROWTH ON INP

This application is a continuation of application Ser. No. 436,681, filed Oct. 26, 1982, now abandoned.

BACKGROUND OF THE INVENTION

This invention relates to the liquid phase epitaxy (LPE) growth of epitaxial layers on Inp substrates.

A major problem encountered in LPE on InP has been the thermal instabilitY of the substrate at growth temperatures. Severe thermal decomposition, resulting in microscopic pitting of the substrate surface, may be largely eliminated by protecting the substrate with excess phosphorus vapor produced, for example, by an indium phosphide cover piece, an elemental phosphorus source, a phosphine source, or an indium-tin-phosphorus solution. However, even on a protected, pit-free substrate, some photoluminescence and defect studies have revealed the existence of a thermally-degraded surface, which must be removed to achieve high quality epitaxial layers and good device performance.

In LPE practice, a clean, undegraded surface with uniform and consistent wetting is commonly produced by melting back the substrate with pure indium just prior to the first epitaxial growth, as described by V. Wrick et al, *Electronic Letters*, vol. 12, p. 394 (1976). A pure indium melt, however, attacks the substrate rapidly and unevenly; the resulting surface of the substrate is not flat but rippled. Surface rippling for a (100)-InP substrate increases with the depth of meltback and also increases with the size of the substrate. For example, when LPE growth is scaled to large ($\sim 15 \times 17$ mm) wafers, surface rippling is a particularly severe problem.

In addition to making subsequent device processing easier, a flat surface is also critical for the performance of many devices. As an example, consider double heterostructure edge-emitting LEDs and lasers. The typical structure comprises a guaternary InGaAsP active layer ($\sim 0.2$ $\mu$m thick) sandwiched between n-InP and p-InP cladding layers. In the ideal (flat surface) case, the emitted light is transmitted along a straight waveguide. If the substrate initially is not flat, however, the subsequent epitaxial layers are also not flat. In this case, the waveguide is not straight, and the surface ripples strongly scatter the light.

Addition of phosphorus to indium has been used for a more controlled meltback as described by K. E. Brown, *Journal of Crystal Growth*, Vol. 20, p. 161 (1973). Although a nearly saturated In/P melt produces flat surfaces, nonuniform wetting often occurs. Consequently, growth is spotty and may not cover the entire substrate surface.

In more complicated devices, such as a buried heterostructure requiring LPE regrowth over a mesa, increased contamination due to additional processing steps (e.g., etching to form the mesa), in addition to the nonideal geometry (e.g., vertical side walls of the mesa), makes clean wipe-off difficult. After the usual In meltback, In-rich beads cling to the mesa. These beads solidify into In-rich inclusions which are sources of dislocations and which degrade device performance. Achieving a clean wipe-off requires removal of essentially all contaminants from the substrate surface. In the usual, single In meltback, contaminants which are not fully dissolved may settle back onto the mesas, leading to incomplete wipe-off.

SUMMARY OF THE INVENTION

In accordance with the present invention, a multiple meltback procedure is employed which maintains flat surface morphology and yields uniform and consistent wetting. The procedure includes at least two steps, each of which effects meltback of a major surface of an InP-containing body before an epitaxial layer is grown. The body may be a substrate alone or a substrate with one or more epitaxial layers already grown thereon. In the first meltback the major surface is briefly brought into contact with an essentially pure In melt in order to remove gross contaminants. Then, the major surface is brought into contact with a slightly undersaturated In/P solution to controllably and uniformly etch away thermal degradation of the surface.

Where the epitaxial layer is to be grown over a raised feature on the body, such as the mesa formed in the fabrication of a buried heterostructure LED, three meltback steps are employed. The first melt oomprises essentially pure In, the second comprises either essentially pure In or a slightly undersaturated In/P solution, and the third comprises a slightly undersaturated In/P solution. The body, with the raised feature thereon, is briefly brought into sequential contact with the first two melts. Then the body is brought into contact with the third melt for controlled meltback. The initial rapid flushing action of the first two steps removes gross contaminants, and an inclusion-free surface results after the third step. As a consequence, buried heterostructure LEDs with reduced defect density have been made using this technique with LPE slider-boat apparatus.

BRIEF DESCRIPTION OF THE DRAWING

My invention, together with its various features and advantages, can be readily understood from the following, more detailed description taken in conjunction with the accompanying drawing, in which the sole FIGURE is a stylus profile of different InP substrate surfaces: (A) an as-polished wafer; (B) a wafer after a single meltback with essentially pure In; and (C) a wafer after a double meltback in accordance with one embodiment of the invention.

DETAILED DESCRIPTION

The invention will be described with reference to LPE growth using horizontal slider-boat apparatus, although the multiple-meltback procedure is also applicable to other LPE arrangements (e.g., tipping techniques or carousel apparatus). As is well known in the art, horizontal slider-boat apparatus typically includes a graphite boat having a plurality of wells for carrying source solutions (melts). These melts are used for growing epitaxial layers and for meltback. The slider, which is also typically made of graphite, has a plurality of recesses for carrying saturation seeds and the substrate on which epitaxial layers are grown. The apparatus is designed so that the slider can be moved under the boat to bring the seeds/substrates sequentially into contact with the melts.

Meltback and epitaxial layer growth take place in an LPE reactor in a flowing ambient such as hydrogen, nitrogen or helium. The reactor includes a furnace for heating the seed/substrates and the melts and for instituting a controlled cooling program to effect epitaxial growth.

In addition, in the examples which follow, materials, dimensions, temperatures and other parameters are provided by way of illustration only and, unless otherwise stated, are not intended to limit the scope of the invention.

The key to my improved meltback procedure is predicated upon a recognition that meltback should accomplish two things: (i) remove gross contaminants (e.g., graphite particles, dust, etching residue, and oxides) from the Inp-containing surface, and (ii) planar-etch away thermal degradation of the surface caused by the evaporation of phosphorus.

Prior to LPE growth of an epitaxial layer, at least two meltback steps were performed in accordance with one embodiment of my invention. Initially, an InP substrate was placed under an Inp cover piece as described bY P. D. Wright et al, *IEEE Transactions on Electronic Devices*, ED-26, p. 1220 (1979). The first and second wells of the boat contained essentially pure indium and a slightly undersaturated In/P melt, respectively. The In was commercially available material which was about 99.9999 percent pure. The In/P melt initially comprised 70 mg of Inp and 10 gm of In, a mixture which was saturated at about 643 degrees C. but slightly undersaturated at the meltback temperature of 650 degrees C. However, meltback can be performed over any temperature range suitable for epitaxial growth, typically 600–700 degrees C. The substrate was first passed rapidly throuoh the pure indium melt to remove the gross contaminants; it is important that the residence time in the first melt be kept brief ($\lesssim 1$ sec) to minimize attack on the substrate. The substrate was then brought under the slightly undersaturated In/P melt to controllably and uniformly planar-etch away the thermally degraded surface. Suitable times for this meltback exceed about 5 sec but do not exceed 120 sec, for the above-defined degree of undersaturation. Twenty seconds of meltback have good results; i.e., a clean, flat, undegraded surface with uniform and consistent wetting for the growth of an epitaxial layer. In my experience, without the first indium melt, the nearly saturated In/P solution did not etch the surface uniformly, and consistent wetting did not occur.

The improvement in surface flatness produced by the foregoing double meltback procedure was quite pronounced on both a macroscopic and a microscopic scale. Photomicrographs were made to compare two (100)-Inp substrates after a shallow ($\sim 5$ μm) layer had been melted away from each. A single, pure In meltback produced prominent ripples. In contrast, the ripples were largely absent from the surface after double meltback in accordance with my invention. On a microscopic scale of more direct consequence for device performance, the improvement in surface morphology was equally dramatic. The FIGURE shows stylus profiles of three surfaces. On the vertical axis 1 div=0.2 μm, a typical active layer thickness of a heterostructure laser; the total lateral span was 160 μm, a typical device length. Curve A shows the smooth, as-polished surface for reference. For a wafer which had $\sim 5$ μm removed by single, pure In meltback (Curve B), the surfaces roughness was on the same order as an active layer thickness. On the other hand, a wafer which had $\sim 5$ μm removed by the foregoing double meltback procedure (Curve C) was considerably smoother, with peak-to-peak undulations $\lesssim 0.02$ μm. The improvement in surface flatness and the impacy of surface flatness on optical device performance was further demonstrated by electroluminescent images obtained from stripe geometry double heterostructure edge-emitters (with 8 μm wide stripes) grown after a single, pure In meltback and after double meltback in accordance with my invention. In both cases, the active layer thickness was 0.16 μm, and $\sim 5$ μm was melted back from the substrate prior to epitaxial growth. In single meltback devices the images had dark bands corresponding to light scattering by surface ripples, whereas in double meltback devices the images showed continuous and uniform light emission.

These double heterostructures included an n-InP (100)-substrate, an n-InP buffer (cladding) layer, an unintentionally doped InGaAsP ($\lambda = 1.3$ μm ) active layer, a p-InP cladding layer, and a p-InGaAsp ($\lambda = 1.1$ μm) cap layer. The double meltback procedure was used prior to the layer.

Using a similar procedure, a buried heterostructure LED was fabricated by repeating the double meltback followed by the epitaxial growth of similar buffer, active, and cladding layers. Then, using photolithography and Br/methanol or HCl/H$_3$PO$_4$ etchants, mesas were formed in the p-InP cladding layer. Subsequently, a triple meltback was performed in accordance with another embodiment of my invention prior to regrowth of epitaxial layers over the mesa. Scanning electron microscopy and transmission cathodoluminescence confirmed that this procedure effectively eliminated In-rich inclusions along the mesa walls. The triple meltback employed three melts: a first melt of essentially pure In; a second melt of either essentially pure In or slightly undersaturated In/P; and a third melt of slightly undersaturated In/P. The substrate, with the mesa thereon, was rapidly passed under the first two melts, preferably without stopping under either melt, and then was brought under the third for controlled etching for a time of 5 sec to remove about 2 μm of material; i.e., to melt back through the active layer and into the n-InP buffer layer outside of the mesa. The multiple meltback sequence was also effective to clean the top of the mesa. The initial rapid flushing action and the first two wipe-offs removed the gross contaminants, and an inclusion-ftee surface (mesa walls) resulted after the third wipe-off. After this meltback procedure, a p-InP layer and a p-InGaAsP layer were regrown over the mesa and the substrate.

It is to be understood that the above-described arrangements are merely illustrative of the many possible specific embodiments which be devised to represent application of the principles of the invention. Numerous and varied other arrangements can be devised in accordance with these principles by those skilled in the art without departing from the spirit and scope of the invention.

What is claimed is:

1. In the manufacture of a device, which includes a layer on the surface of an InP-containing semiconductor body, a method of preparing the surface comprising the steps of:
   (a) heating the body to an elevated temeprature,
   (b) bringing the surface into contact with an essentially pure In melt for a time period long enough to remove gross contaminants, but short enough to avoid formation of surface ripples, and
   (c) bringing the surface into contact with a melt mixture of In slightly undersaturated with P for a time period long enough to remove thermal degradation from the surface.

2. The method of claim 1 including, after step (c), the additional step of growing the layer as at least one epitaxial layer on the surface.

3. The method of claim 2 including, after step (c), the steps of growing the layer as a plurality of epitaxial layers on the surface to form a heterostructure.

4. The method of claim 1 wherein all of the steps are performed in an ambient of flowing gas selected from the group consisting of hydrogen nitrogen and helium.

5. The method of claim 1 wherein, in step (a), the body is heated to a temperature in the range of about 600 to 700 degrees C.

6. The method of claim 1 wherein, during step (b), the surface is maintained in contact with the melt for a time period $\lesssim 1$ sec.

7. The method of claim 6 wherein, during step (c), the surface is maintained in contact with the melt mixture for a time period of about 5–120 sec.

8. The method of claim 1 including, between steps (b) and (c), the additional step (b') of bringing the surface into contact with a melt of material selected from the group consisting of essentially pure In and a mixture of In slightly undersaturated with P.

9. The method of claim 8 wherein the surface is moved in continuous fashion from contact with the melt in step (b) to the melt in step (b').

10. The method of claim 8 wherein, in step (c), the surface is maintained in contact with the melt for a time period of about 5 sec.

11. The method of claims 8, 9, or 10 wherein the body has a raised feature on the surface.

12. The method of claim 11 including the steps of epitaxially growing a heterostructure of layers on the surface and etching the layers to form a mesa constituting the raised feature, and including the step of growing at least one epitaxial layer over the mesa.

13. A method of manufacturing a device, which includes preparing the surface of an InP substrate for liquid phase epitaxial growth of a layer thereon, comprising the steps of:
(a) heating the substrate to an elevated temperature suitable for epitaxial growth in gas,
(b) bringing the surface into contact with an essentially pure In melt for a time period long enough to remove gross contaminants from the surface, but short enough to avoid formation of surface ripples,
(c) bringing the surface into contact with a melt mixture of In slightly undersaturated with P at the temperature of step (a), thereby to remove thermal degradation from the surface caused by the evaporation of P therefrom, and
(d) bringing the surface into contact with a source melt for a time period effective to grow the layer thereon to the desired thickness.

14. The method of claim 13 wherein, in step (d), an In-containing layer is grown on the surface.

15. The method of claim 14 wherein in step (a) the substrate is heated to a temperature of about 600–700 degrees C. in a gas selected from the group consisting of hydrogen, nitrogen and helium, and in step (b) the surface is maintained in contact with the pure In melt for a time $\lesssim 1$ sec.

* * * * *